United States Patent [19]
Lur

[11] Patent Number: 5,663,599
[45] Date of Patent: Sep. 2, 1997

[54] METAL LAYOUT PATTERN FOR IMPROVED PASSIVATION LAYER COVERAGE

[75] Inventor: Water Lur, Taipei, Taiwan

[73] Assignee: United Microelectronics Corporation, Hsin-Chu, Taiwan

[21] Appl. No.: 607,732

[22] Filed: Feb. 27, 1996

Related U.S. Application Data

[62] Division of Ser. No. 280,221, Jul. 25, 1994, Pat. No. 5,494,853.

[51] Int. Cl.⁶ .................................................. H01L 23/48
[52] U.S. Cl. .......................... 257/750; 257/774; 257/775
[58] Field of Search .................................. 257/750, 752, 257/774, 775

[56] References Cited

U.S. PATENT DOCUMENTS

| | | | |
|---|---|---|---|
| 5,004,704 | 4/1991 | Maeda et al. | 437/195 |
| 5,032,890 | 7/1991 | Ushiku et al. | 357/41 |
| 5,124,275 | 6/1992 | Selle et al. | 437/80 |
| 5,166,101 | 11/1992 | Lee et al. | 437/238 |
| 5,182,235 | 1/1993 | Eguchi | 437/238 |
| 5,192,715 | 3/1993 | Sliwa, Jr. et al. | 437/195 |
| 5,278,103 | 1/1994 | Mallon et al. | 437/240 |
| 5,281,555 | 1/1994 | Cho | 437/195 |
| 5,310,700 | 5/1994 | Lien et al. | 437/195 |
| 5,357,140 | 10/1994 | Kozasa | 257/752 |
| 5,407,860 | 4/1995 | Stoltz et al. | 437/180 |
| 5,441,915 | 8/1995 | Lee | 437/195 |
| 5,476,817 | 12/1995 | Numata | 437/195 |
| 5,516,720 | 5/1996 | Lur et al. | 437/67 |

FOREIGN PATENT DOCUMENTS

| | | |
|---|---|---|
| 62-265741 | 11/1987 | Japan . |
| 3-016223 | 1/1991 | Japan . |

OTHER PUBLICATIONS

Stanley Wolf, Ph.D., "*Silicon Processing for the VLSI Era*," vol. 2: Process Integration, pp. 200–204.

*Primary Examiner*—Tom Thomas
*Assistant Examiner*—Roy Potter
*Attorney, Agent, or Firm*—William H. Wright

[57] ABSTRACT

An integrated circuit incorporates a metal wiring line layout scheme which reduces the likelihood of incorporating holes through the passivation layer which covers the metal wiring line. Wiring lines are formed so as to have constant separation around bends in the wiring lines, typically by also increasing the width of the wiring lines around the bends. This layout reduces the likelihood of forming holes in the passivation layer between wiring lines. Holes are prevented near the ends of wiring lines either by providing dummy wiring lines offset from the ends of the wiring lines or by reducing the height of the wiring lines at the ends of the wiring lines. The ends of wiring lines can be sloped by providing dummy vias at the ends of the wiring lines and forming the ends of the wiring lines in the dummy vias.

12 Claims, 4 Drawing Sheets

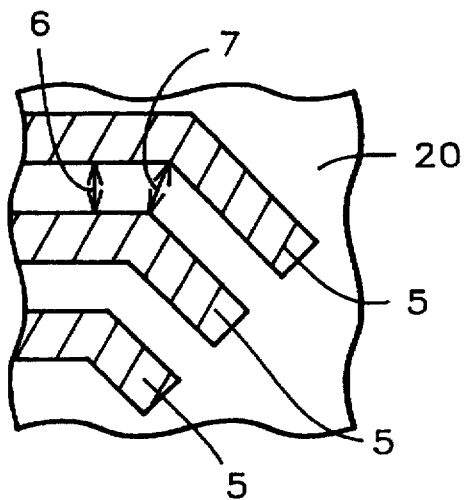
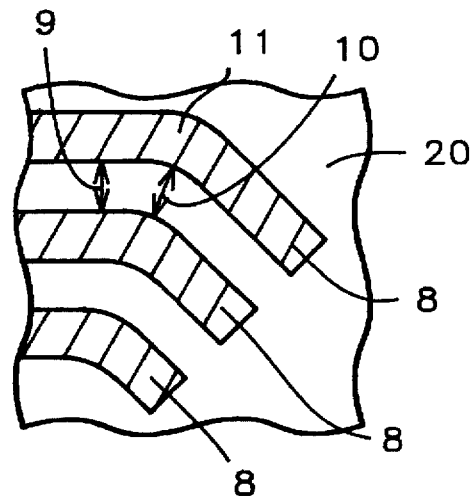
FIG. 1A
Prior Art
FIG. 1B
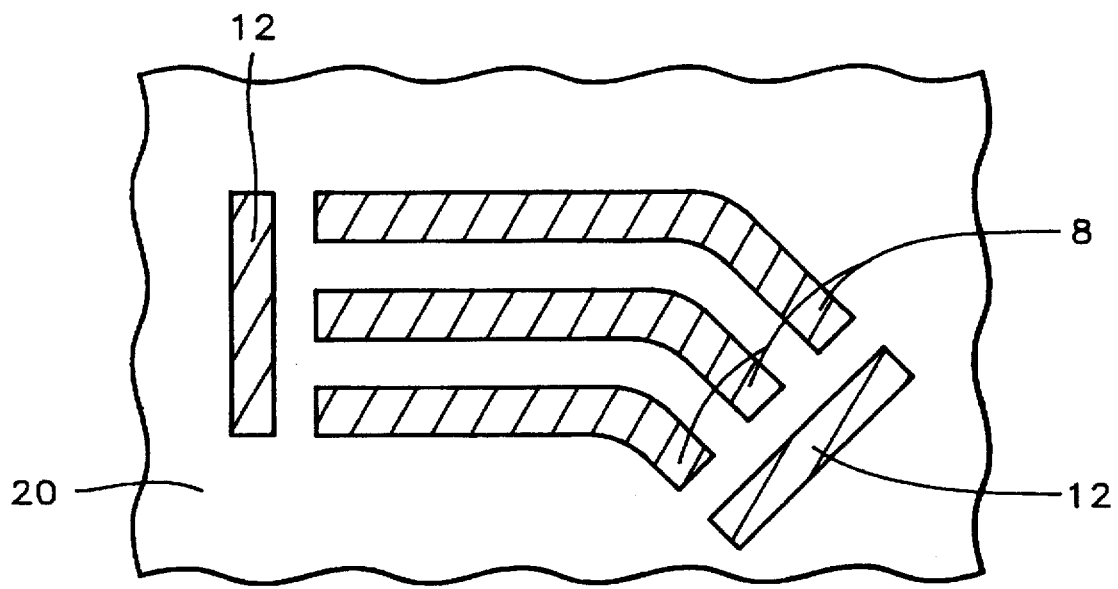
FIG. 2

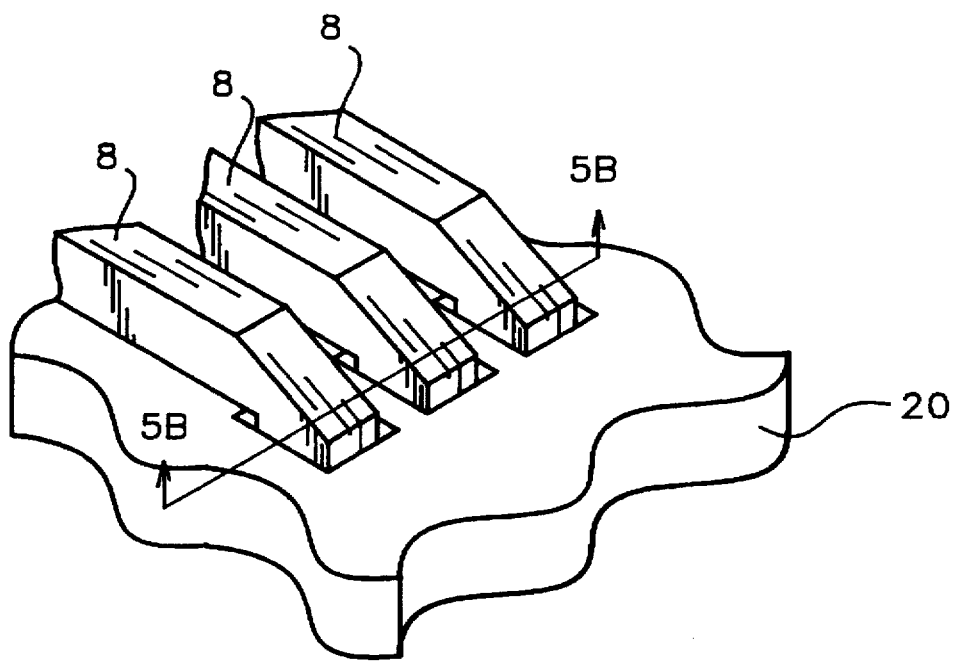
FIG. 3B
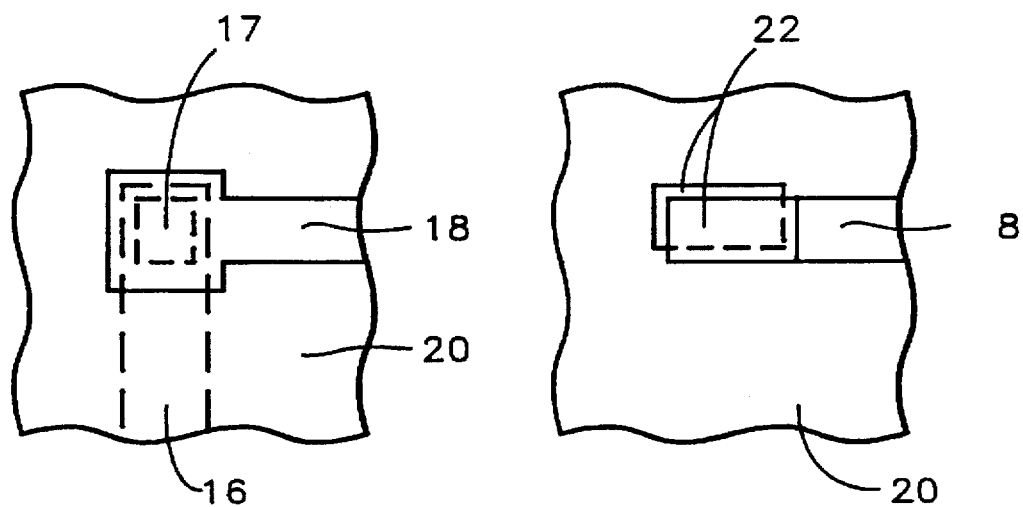
FIG. 4A
Prior Art
FIG. 4B

METAL LAYOUT PATTERN FOR IMPROVED PASSIVATION LAYER COVERAGE

This is a divisional of application Ser. No. 08/280,221, filed on Jul. 25, 1994 and now U.S. Pat. No. 5,494,853.

BACKGROUND OF THE INVENTION

(1) Field of the Invention

The invention relates to a method of preventing holes in a passivation layer, and more particularly, to a method of preventing holes in a passivation layer by metal layout in the fabrication of integrated circuits.

(2) Description of the Prior Art

The step coverage of the passivation layer on high aspect ratio metal lines is very poor—less than 40%. Also, keyhole type tunnels are formed between metal lines with spacing smaller than about 1 micrometer. These tunnels open up at metal line terminals, at points where the underlying metal layer is absent, and at turns in metal lines. During resist coating, the resist sinks into the underlying tunnels, making the resist layer thinner in these areas. The thinner resist generates holes in the passivation layer after pad etch which then degrades reliability. The sunken resist also causes a resist residue problem.

One of the temporary methods used to suppress the problem of holes in the passivation layer is to coat a thicker resist of between about 20,000 to 40,000 Angstroms in order to retain enough thickness of resist after the resist has sunk into the tunnels. The thickness is required to withstand the subsequent pad etching. The drawbacks of this solution are longer exposure time and longer resist stripping time. The resist residue problem still exists.

Other attempts have been made to resolve the problem. These include trapezoidally patterned metal lines to improve subsequent passivation step coverage and avoid the formation of keyholes, additional spin-on-glass coating to get a better passivation step coverage, using tetraethoxysilane (TEOS)/ozone based plasma enhanced chemical vapor deposited (PECVD) oxide as passivation, better planarization before the last metal layer, and implementation of chemical mechanical polishing (CMP), liquid phase deposition (LPD) oxide, or polyimide. All of these attempts suffer from process maturity, productivity, and complexity issues.

U.S. Pat. No. 5,032,890 to Ushiku et al describes the formation of dummy lines for improved next level coverage of an interconnection layer.

SUMMARY OF THE INVENTION

A principal object of the present invention is to provide an effective and very manufacturable method of forming the passivation layer of an integrated circuit.

Another object of the present invention is to provide a method of forming the passivation layer of an integrated circuit which does not contain holes.

A further object of the invention is to use metal layout to prevent the formation of holes in an overlying passivation layer.

Yet another object is to avoid the resist residue problem.

In accordance with the objects of this invention a new method of forming the passivation layer of an integrated circuit using metal layout is achieved. An insulating layer is formed over semiconductor device structures in and on a semiconductor substrate. Metal lines are formed having a metal line layout in which the metal lines have a fixed spacing throughout their length and larger width around a turn than they have throughout the remainder of their length. Metal islands are formed perpendicular to the metal lines at the terminals of the metal lines. Dummy vias are opened in the insulating layer at the terminals of the metal lines wherein the terminals of the metal lines fill the dummy vias thereby reducing the aspect ratio of the spacing of said metal lines. A passivation layer is deposited over the metal lines wherein tunnels are formed within the passivation layer between the metal lines and at the terminals of the metal lines. The metal layout of the present invention prevents openings from being made within the passivation layer to the tunnels. The passivation layer is covered with a resist layer. The resist layer has a relatively constant thickness because the resist does not sink into the tunnels. The passivation layer is patterned. Holes are not formed within the passivation layer because of the relatively constant thickness of the resist layer.

BRIEF DESCRIPTION OF THE DRAWINGS

In the accompanying drawings forming a material part of this description, there is shown:

FIG. 1A schematically illustrates a top view of metal lines of the prior art.

FIGS. 1B and 2 schematically illustrate a top view of metal lines of the present invention.

FIG. 3B schematically illustrates in cross-sectional representation metal lines of the present invention.

FIG. 4A schematically illustrates a top view of a via of the prior art.

FIG. 4B schematically illustrates a top view of a dummy via of the present invention.

DETAILED DESCRIPTION OF THE PREFERRED EMBODIMENTS

Figure 3A:
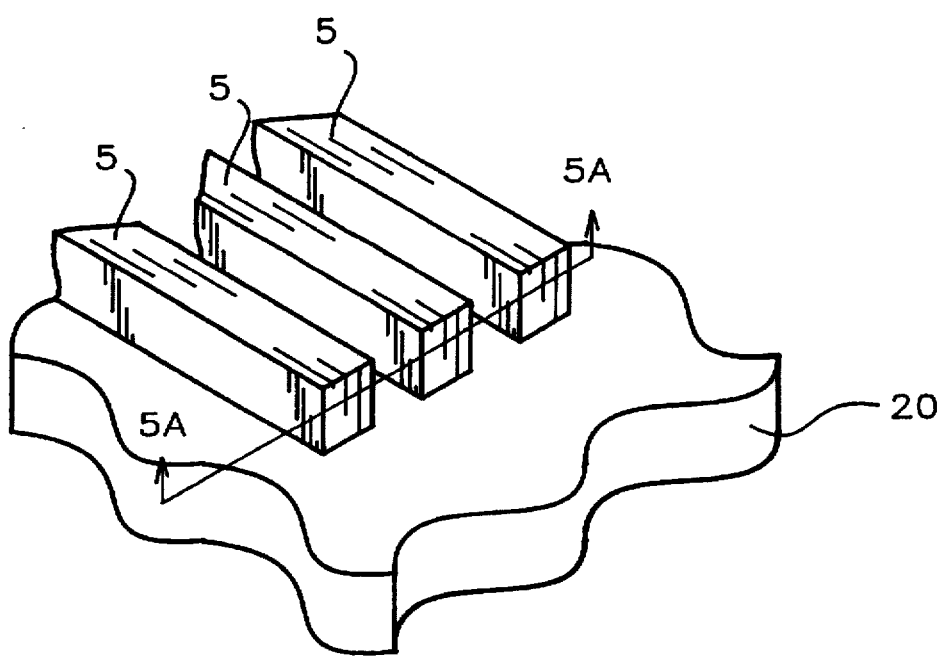
FIG. 3A schematically illustrates in cross-sectional representation metal lines of the prior art.

The invention uses metal layout to prevent holes in the passivation layer caused by resist sinking into tunnels formed between metal lines. Three types of metal layout are used to resolve this problem. The first metal layout improvement will be described while referring to FIGS. 1A and 1B. Referring now more particularly to FIG. 1A, there is illustrated a top view of metal lines 5 formed by a conventional process of the prior art. The spacing 6 where the lines are horizontal is different from the spacing 7 where the lines turn.

Referring now to FIG. 1B, the metal lines 8 of the present invention have a fixed spacing. The spacing 9 where the lines are horizontal is the same as the spacing 10 where the lines turn. Also, the width of the metal line is slightly larger at the turn 11 than it is at other points on the line. Tunnels are inevitably formed between metal lines. The fixed spacing and extra metal width can prevent the formation of openings to these tunnels.

Referring now to FIG. 2, a second metal layout will be described. Metal lines 8 are again shown in top view. Additional metal sections or islands 12 are formed ahead of the terminals of a series of metal lines. These metal islands are used to reduce the openings of tunnels at the terminals of the metal lines.

The third metal layout improvement will be described with reference to FIGS. 3A and 3B. FIG. 3A illustrates a cross-section of the terminals of a series of metal lines 5 of the prior art formed on top of an insulating layer 20. In the process of the invention, dummy vias are formed in the insulating layer 20 at the terminals of the metal lines. These dummy vias 22 do not extend all the way through the insulating layer 20. When the metal lines 8 are deposited, they fill the dummy vias 22 as shown in FIG. 3B. The dummy vias can reduce the aspect ratio of the metal spacing and thus prevent the opening of tunnels at the terminals of the metal lines.

The dummy vias of the present invention are formed without dogbone layout. Vias are conventionally opened through an insulating layer to an underlying conducting layer. A second conducting layer fills the via and completes the electrical connection between the two conducting layers. FIG. 4A illustrates the top view of a via 17 opened through insulating layer 20 to a first metal layer 16. The second metal layer 18 fills the via and surrounds it in a dogbone shape. The dummy via of the present invention is shown in FIG. 4B. The dummy via is opened in the insulating layer 20, but not all the way through the layer 20. There is no underlying metal layer to be contacted by metal layer 8. Metal layer 8 fills the dummy via. Some misalignment is possible and will not cause a problem.

After the metal lines have been formed, a passivation layer of phosphosilicate glass and/or silicon nitride or oxynitride is deposited over the metal lines by chemical vapor deposition or physical vapor deposition. Because of poor step coverage, tunnels may be formed within the passivation layer between metal lines. The metal layout described above will prevent the formation of openings to these tunnels and will prevent the formation of tunnels at the terminals of the metal lines. The second metal layout, as shown in FIG. 2, can reduce the openings to tunnels. The first and third metal layouts will prevent the formation of openings to the tunnels.

Figure 5A:
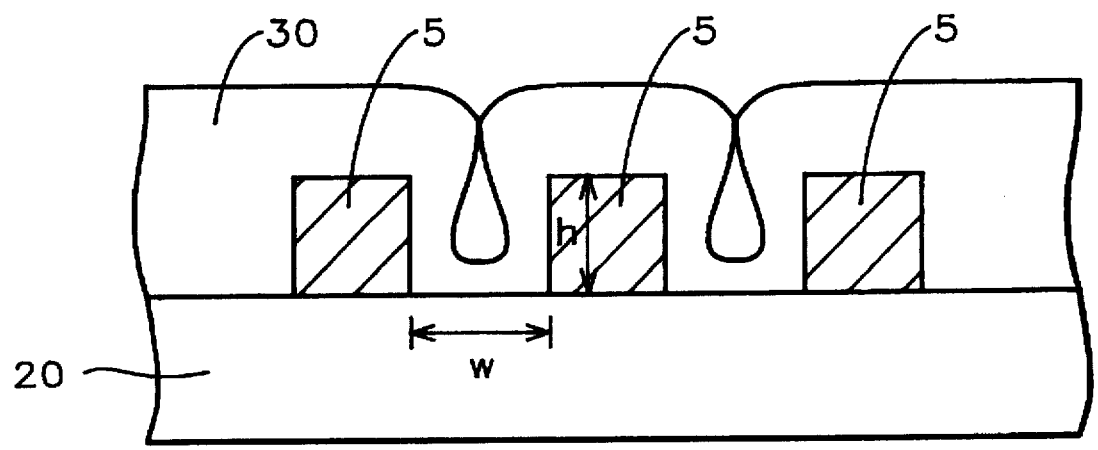
FIG. 5A schematically illustrates in cross-sectional representation view 5A—5A of FIG. 3A of the prior art.
Figure 5B:
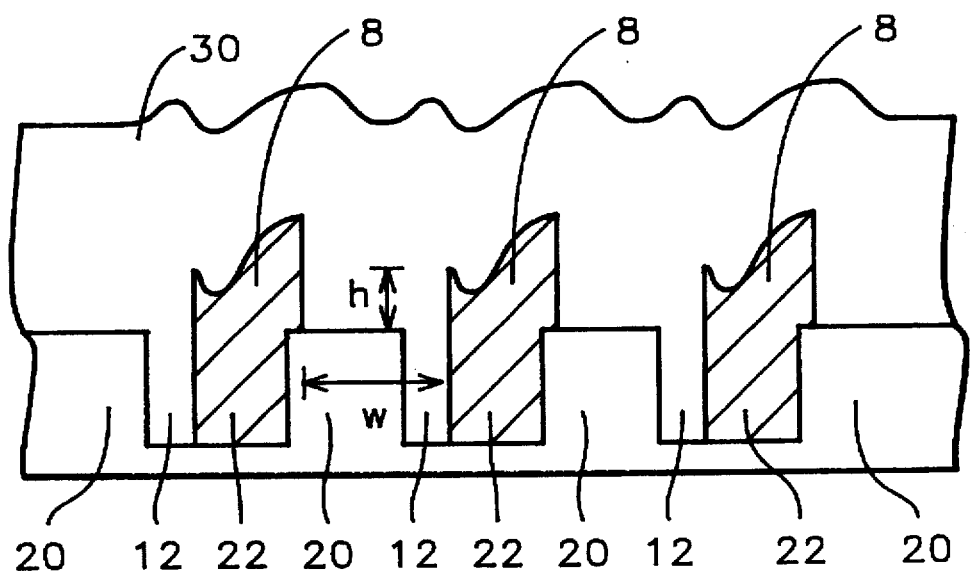
FIG. 5B schematically illustrates in cross-sectional representation view 5B—5B of FIG. 3B of the present invention.

After passivation 30, the cross-sectional view in FIG. 3B along line 5B—5B can be schematically shown in FIG. 5B. Compared with FIG. 5A (the cross-sectional view in FIG. 3A along line 5A—5A), the aspect ratio of the metal spacing (h/w) in FIG. 5B is smaller. Even if there is a void 12 after passivation layer deposition caused by misalignment, there will be no opening formed to the void.

The passivation layer is covered with a layer of resist. Because the metal layout prevents openings to the tunnels in the passivation layer, the resist does not sink into the tunnels. Therefore, the resist layer has a constant thickness. The resist is exposed and developed to form the desired pattern and the passivation layer is etched away where it is not covered by the resist. The resist layer is removed completely. No residue remains within the tunnels because the resist does not sink into the tunnels. Since the resist layer had a constant thickness, the passivation layer does not have holes in it.

The metal layout of the present invention reduces or prevents the opening of tunnels formed between high aspect ratio metal lines. This prevents the generation of holes in the overlying passivation layer caused by resist thinning because the resist does not sink into the tunnels.

While the invention has been particularly shown and described with reference to the preferred embodiments thereof, it will be understood by those skilled in the art that various changes in form and details may be made without departing from the spirit and scope of the invention.

What is claimed is:

1. An integrated circuit device comprising:
   an insulating layer overlying semiconductor device structures in and on a semiconductor substrate;
   metal lines overlying said insulating layer, said metal lines having a turn, said metal lines extending in parallel in a first direction on one side of said turn and extending in parallel in a second direction on another side of said turn, wherein said metal lines have a fixed spacing throughout the length of said metal lines including around said turn; and
   a passivation layer overlying said metal lines.

2. The integrated circuit device of claim 1, wherein said metal lines have a larger width around said turn than they have throughout the remainder of their length.

3. The integrated circuit of claim 1, wherein said metal lines terminate in a set of ends.

4. The integrated circuit of claim 3, further comprising dummy vias extending into said insulating layer at said ends of said metal lines, with one of said dummy vias at each of said ends of said metal lines, said ends of said metal lines disposed within said dummy vias so that a height above said insulating layer of said ends of said metal lines is lower than a height above said insulating layer of said metal lines away from said ends of said metal lines.

5. The integrated circuit of claim 4, wherein said dummy vias extend partially through said insulating layer.

6. The integrated circuit device of claim 5, wherein said metal lines have a larger width around said turn than they have throughout the remainder of their length.

7. The integrated circuit of claim 3, further comprising a dummy via extending into said insulating layer at one of said ends of one of said metal lines, with said one of said metal lines disposed within said dummy via so that a height above said insulating layer of said one of said ends of said metal lines is lower than a height above said insulating layer of said one of said metal lines away from said one of said ends.

8. The integrated circuit of claim 7, wherein said dummy via extends partially through said insulating layer.

9. The integrated circuit device of claim 7, wherein said metal lines have a larger width around said turn than they have throughout the remainder of their length.

10. The integrated circuit of claim 3, further comprising a dummy metal line on said insulating layer extending across said ends of said metal lines.

11. The integrated circuit of claim 10, wherein said metal lines extend in said first direction at said ends and wherein said dummy metal line extends in a direction perpendicular to said first direction.

12. The integrated circuit device of claim 11, wherein said metal lines have a larger width around said turn than they have throughout the remainder of their length.

* * * * *